(12) United States Patent
Chou

(10) Patent No.: US 8,451,150 B2
(45) Date of Patent: May 28, 2013

(54) TRANSCEIVER AND METHOD FOR CONVERTING SIGNALS OF THE TRANSCEIVER THEREOF

(75) Inventor: Chia-Hua Chou, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 553 days.

(21) Appl. No.: 12/758,025

(22) Filed: Apr. 11, 2010

(65) Prior Publication Data

US 2011/0249710 A1 Oct. 13, 2011

(51) Int. Cl.
*H03M 1/02* (2006.01)

(52) U.S. Cl.
USPC .......................................... 341/108; 341/155

(58) Field of Classification Search
USPC .................. 341/108, 155, 161, 162, 163, 172, 341/120, 165; 375/296, 219; 455/126, 115, 455/324
See application file for complete search history.

(56) References Cited

U.S. PATENT DOCUMENTS

| 6,608,580 | B2 * | 8/2003 | Hsueh | 341/155 |
| 6,950,444 | B1 * | 9/2005 | Holmquist et al. | 370/476 |
| 7,650,119 | B2 * | 1/2010 | Rafi et al. | 455/76 |
| 2009/0278719 | A1 * | 11/2009 | Braswell | 341/143 |

* cited by examiner

*Primary Examiner* — Joseph Lauture
(74) *Attorney, Agent, or Firm* — Winston Hsu; Scott Margo

(57) ABSTRACT

A transceiver includes an analog-to-digital converter (ADC) having an embedded processing circuit and an embedded digital-to-analog converting (DAC) unit. The ADC is arranged to convert an analog input signal into a digital output signal during a first operational phase of the transceiver. The embedded processing circuit is arranged to generate a digital code according to the analog input signal and an analog signal. The DAC unit is coupled to the embedded processing circuit, wherein the embedded DAC unit is arranged to convert the digital code into the analog signal during the first operational phase, and is arranged to convert a digital input signal into an analog output signal during a second operational phase of the transceiver.

18 Claims, 8 Drawing Sheets

(5A)

(5B)

TRANSCEIVER AND METHOD FOR CONVERTING SIGNALS OF THE TRANSCEIVER THEREOF

BACKGROUND

The disclosed embodiments of the present disclosure relate to a transceiver, and more particularly, to a transceiver having an RXADC and a TXDAC which share the same embedded DAC unit of the RXADC.

In a traditional baseband analog-to-digital conversion/digital-to-analog conversion (ADC/DAC) architecture, individual RXADC and TXDAC are required. Since uplinks and downlinks of communications are separated when being applied to a time-domain duplex (TDD) system, the RXADC and TXDAC of the ADC/DAC architecture need not operate simultaneously.

FIG. 1 is a diagram illustrating a conventional transceiver 100. The conventional transceiver 100 includes an RXADC 110 and a TXDAC 120. Herein the RXADC 110 is used for converting an analog input signal $S_{AIN}$ into a digital output signal $S_{DOUT}$, and the TXDAC 120 is used for converting a digital input signal $S_{DIN}$ into an analog output signal $S_{AOUT}$. The RXADC 110 can be implemented by a successive-approximation register (SAR) ADC. As one can know, the SAR ADC is a type of analog-to-digital converter that converts an analog input signal (e.g., $S_{AIN}$) into a digital code via a binary search through all possible quantization levels before finally converging upon a digital output signal $S_{DOUT}$. Since operations of the SAR ADC are already well-known to a person of average skill in the pertinent art, therefore, additional description is omitted here for brevity. As one can know, individual DAC units are required for the RXADC 110 and the TXDAC 120 of the conventional transceiver 100 since they are separate components.

However, a DAC unit usually occupies a large layout area. In addition, the DAC unit of the RXADC 110 and the DAC unit of the TXDAC 120 need not operate simultaneously when being applied to a TDD system, as a result, one of these two DAC units is idle when transmitting signals or receiving signals. A novel architecture is therefore demanded for considerations of layout area and cost.

SUMMARY

It is an objective of the claimed disclosure to provide a transceiver and a related method to solve the abovementioned problems.

In accordance with exemplary embodiments of the present disclosure, a transceiver is disclosed.

According to a first aspect of the present disclosure, a transceiver is provided. The transceiver includes an ADC. The ADC is arranged to convert an analog input signal into a digital output signal during a first operational phase of the transceiver. The ADC includes an embedded processing circuit and an embedded DAC unit. The embedded processing circuit is arranged to generate a digital code according to the analog input signal and an analog signal. The DAC unit is coupled to the embedded processing circuit, wherein the embedded DAC unit is arranged to convert the digital code into the analog signal during the first operational phase, and is arranged to convert a digital input signal into an analog output signal during a second operational phase of the transceiver. The first operational phase can be a receiving phase, and the second operational phase can be a transmitting phase.

According to a second aspect of the present disclosure, a method for converting signals of a transceiver is provided.

The transceiver includes an analog-to-digital converter (ADC) and a buffer, wherein the ADC includes an embedded processing circuit and an embedded digital-to-analog converting (DAC) unit. The method includes the following steps: generating a digital code according to an analog input signal and an analog signal; during a first operational phase of the transceiver, utilizing the embedded DAC unit to convert the digital code into the analog signal, so that the analog input signal is converted into a digital output signal; and during a second operational phase of the transceiver, utilizing the embedded DAC unit to convert a digital input signal into an analog output signal.

These and other objectives of the present disclosure will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
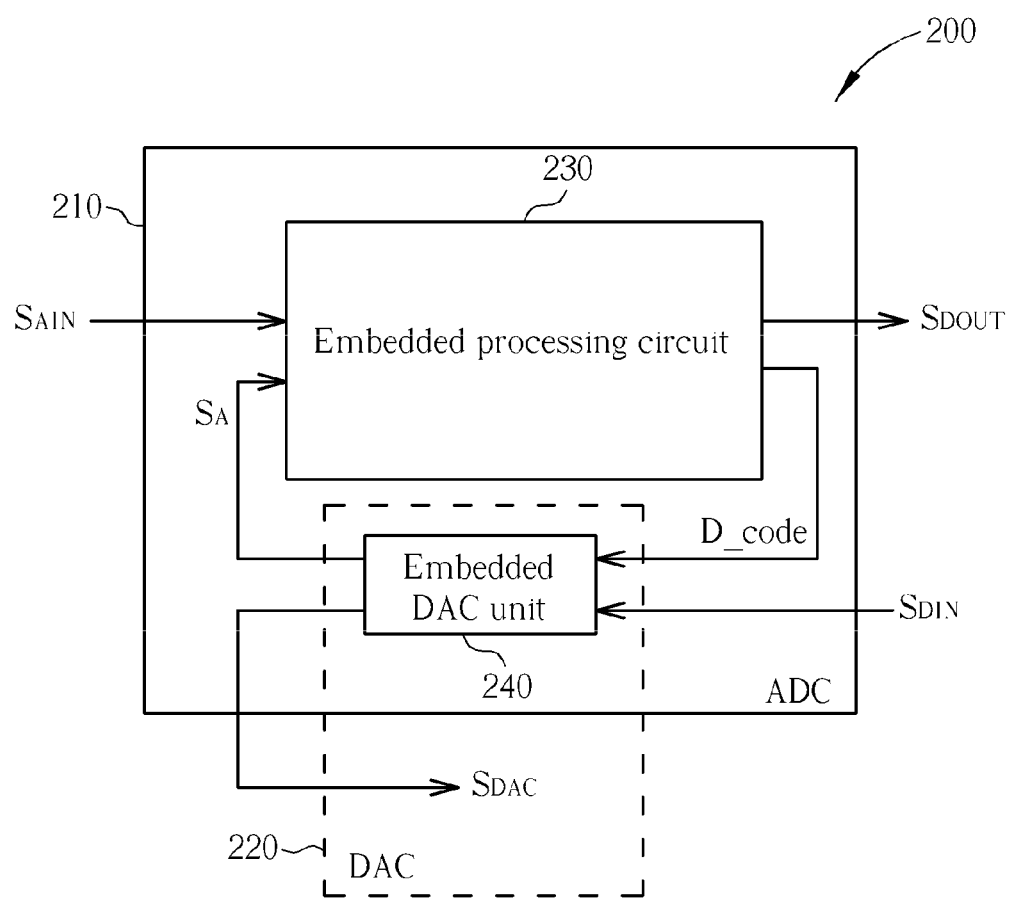
FIG. 2 is a diagram of a transceiver according to a first exemplary embodiment of the present disclosure.

FIG. 2 is a diagram of a transceiver 200 according to a first exemplary embodiment of the present disclosure. The transceiver 200 includes an ADC 210, and the ADC 210 is arranged to convert an analog input signal $S_{AIN}$ into a digital output signal $S_{DOUT}$ during a first operational phase of the transceiver 200. As shown in FIG. 2, the ADC 210 includes an embedded processing circuit 230 and an embedded DAC unit 240, wherein both of the embedded processing circuit 230 and the embedded DAC unit 240 are disposed inside the ADC 210. The embedded processing circuit 230 is arranged to generate a digital code D_code according to the analog input signal $S_{AIN}$ and an analog signal $S_A$. In addition, the embedded DAC unit 240 is coupled to the embedded processing circuit 230. What calls for special attention is that the embedded DAC unit 240 is arranged to convert the digital code D_code into the analog signal $S_A$ during the first operational phase of the transceiver 200, and is arranged to convert the digital input signal $S_{DIN}$ into the DAC output signal $S_{DAC}$ during a second operational phase of the transceiver 200.

Please note that the DAC output signal $S_{DAC}$ might be related to the analog signal $S_A$. In one embodiment, the DAC output signal $S_{DAC}$ may be identical to the analog signal $S_A$. Under this condition, because the DAC output signal $S_{DAC}$ and the analog signal $S_A$ are generated during different operational phases, they can share the same output path. In another embodiment, the DAC output signal $S_{DAC}$ can be generated by adjusting the analog signal $S_A$. For example, the DAC output signal $S_{DAC}$ may be a multiple or a duplication of the analog signal $S_A$, but the present disclosure is not limited to this only.

Be noted that, the abovementioned first operational phase of the transceiver 200 is a receiving phase, and the second operational phase of the transceiver 200 is a transmitting phase. In other words, the ADC 210 can be viewed as an RXADC and the DAC 220 can be viewed as a TXDAC. Please also note that the transceiver 200 can be applied to a time-domain duplex (TDD) system, but this in no way should be considered to be limitations of the scope of the present disclosure. As a result, uplinks and downlinks of the transceiver 200 are separated, and thus the ADC 210 and DAC 220 of the transceiver 200 need not operate simultaneously. That is to say, the embedded DAC unit 240 is used as a converting component of the ADC 210 during the receiving phase, while it also acts as a converting component of the DAC 220 during the transmitting phase.

Figure 1:
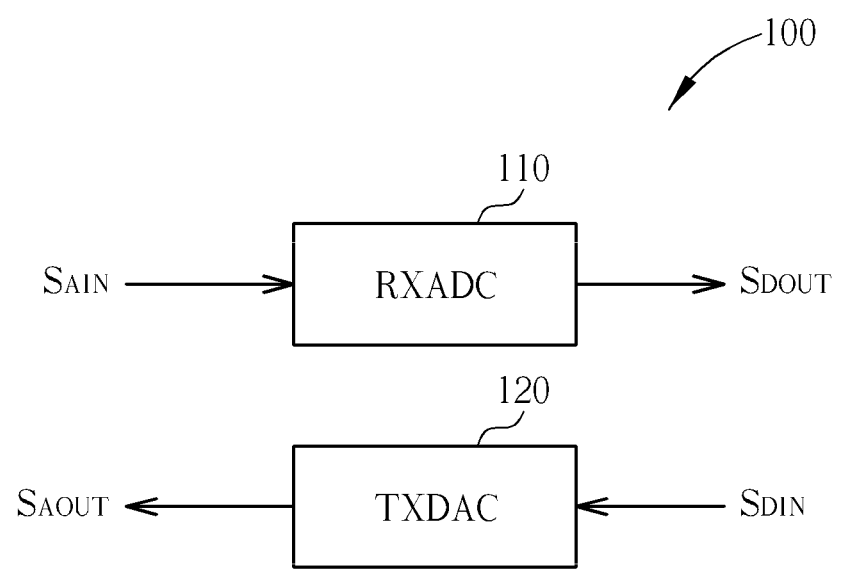
FIG. 1 is a diagram illustrating a conventional transceiver.

As one can image from FIG. 1 and FIG. 2, the individual DAC unit originally adopted in the TXDAC 120 can be saved by reusing the embedded DAC unit 240 to perform the conversion during the receiving phase (i.e., $S_{AIN} \rightarrow D_{DOUT}$) and the conversion during the transmitting phase (i.e., $S_{DIN} \rightarrow S_{DAC}$). Therefore, the cost and the layout area for the TXADC can be reduced dramatically.

Figure 3:
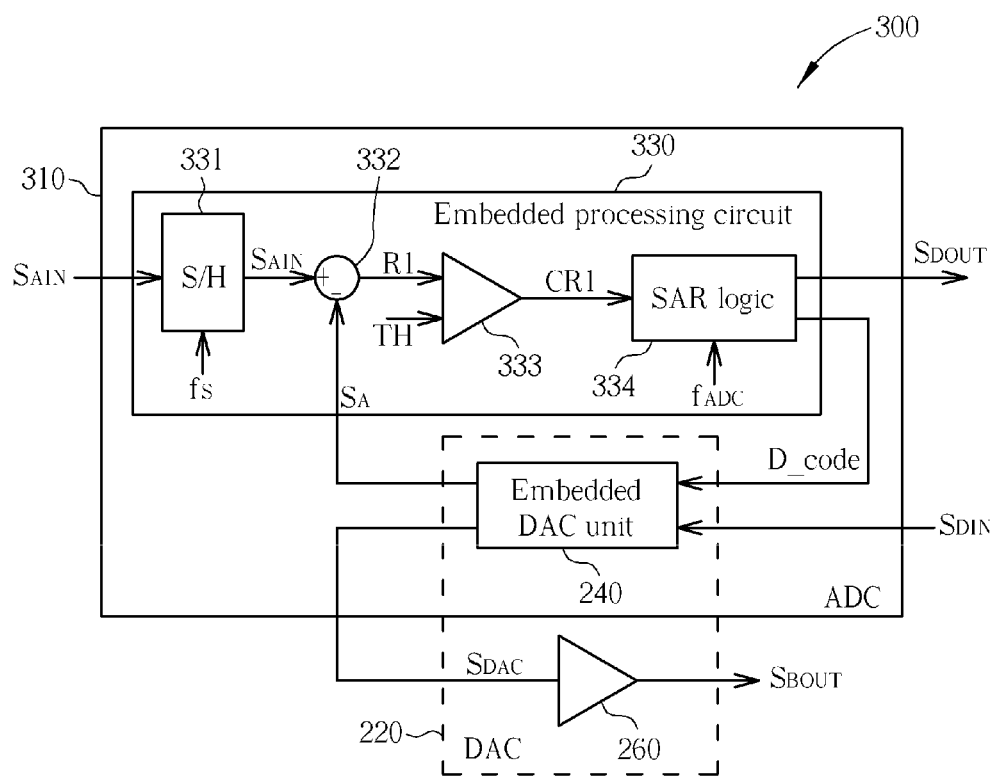
FIG. 3 is a diagram of a transceiver according to a second exemplary embodiment of the present disclosure.

FIG. 3 is a diagram of a transceiver 300 according to a second exemplary embodiment of the present disclosure. The transceiver 300 includes an ADC 310 as well as a buffer 260, wherein the ADC 310 also includes an embedded processing circuit 330 and an embedded DAC unit 240. In this embodiment, the ADC 310 is implemented by a successive-approximation register (SAR) ADC. Hence, the embedded processing circuit 330 is arranged to generate the digital code D_code according to the analog input signal $S_{AIN}$ and the analog signal $S_A$. As can be seen from FIG. 3, the embedded processing circuit 330 further includes a sampling-and-holding unit 331, an adder 332, a comparator 333 and a SAR logic 334. The sampling-and-holding unit 331 is arranged to sample and hold the analog input signal $S_{AIN}$ according to a sampling frequency fs. The adder 332 is arranged to perform an adding operation (or a subtraction operation) upon the analog input signal $S_{AIN}$ and the analog signal $S_A$ so as to generate an operating result R1. The comparator 333 is arranged to compare the operating result R1 with an threshold TH so as to generate a comparison result CR1. The SAR logic 334 is coupled to the comparator 333 for providing the digital code D_code according to the comparison result CR1.

Furthermore, a buffer 260 can be coupled to the embedded DAC unit 240 of the ADC 310, for buffering the DAC output signal $S_{DAC}$ to generate a buffer output signal $S_{BOUT}$. As a result, a combination of the embedded DAC unit 240 and the buffer 260 acts as a DAC (e.g., 220, which is also represented by dotted lines) arranged to convert the digital input signal $V_{DIN}$ into the buffer output signal $S_{BOUT}$ during the second operational phase of the transceiver 300.

Figure 7:
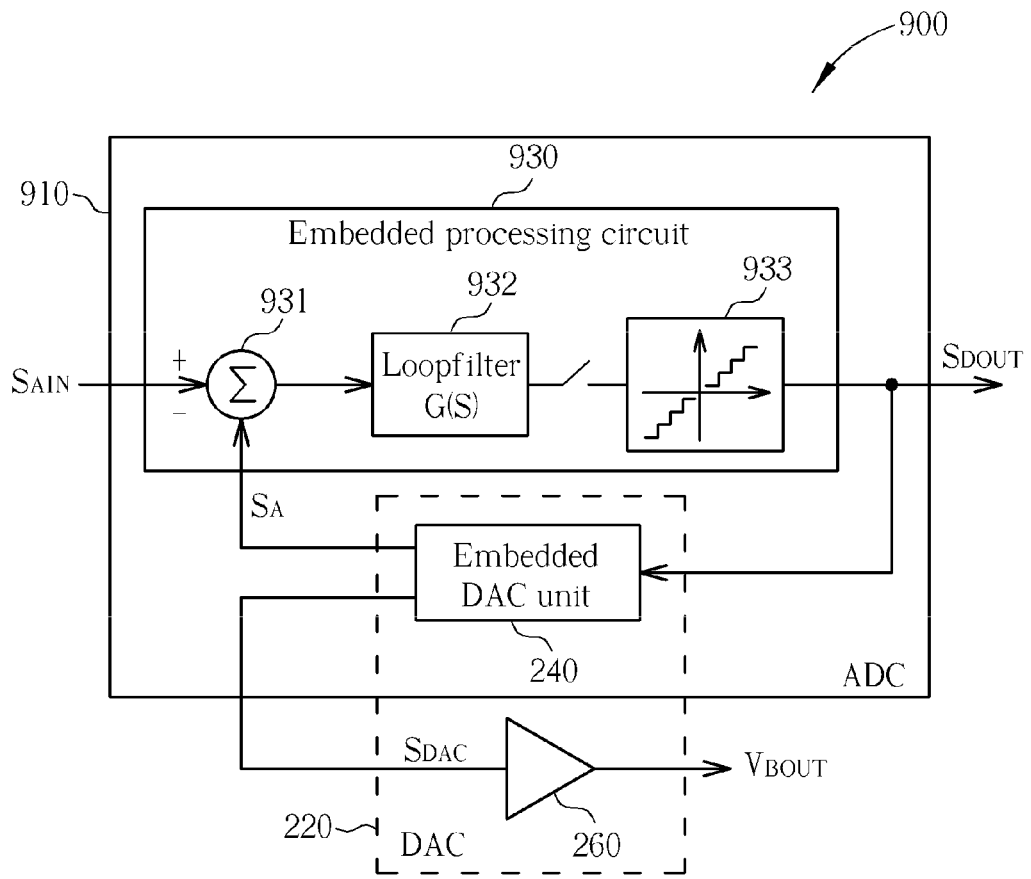
FIG. 7 is a diagram of a transceiver according to a sixth exemplary embodiment of the present disclosure.

In this embodiment, the ADC 310 of the transceiver 300 is implemented by a SAR ADC, but this should not be construed as a limitation of the present disclosure. In other embodiments, the ADC 310 can be implemented by a continuous-time ADC, such as a continuous-time sigma-delta ADC as illustrated in FIG. 7, or any type of ADCs equipped with an embedded DAC unit, which also belongs to the scope of the present disclosure.

What's more, the embedded DAC unit 240 can be implemented by a switched capacitor DAC, a resistor-string DAC, or a combination of a switched capacitor DAC and a resistor-string DAC. But this is not meant to be a limitation to the scope of the present disclosure, and the embedded DAC unit 240 can be implemented by DAC units of other types. What calls for special attention is that the DAC unit originally adopted in the TXDAC 120 may be implemented by a current steering DAC. If the embedded DAC unit 240 (e.g., a switched-capacitor DAC) is reused to replace the DAC unit (e.g., a current steering DAC) originally adopted in the TXDAC, a glitch issue may occur due to different characteristics of these two DAC units. Nevertheless, by adding some solutions, this glitch issue can be solved. As an illustration, the buffer 260 can be designed with an anti-glitch buffer; or special treatments may be made upon signal coding in order to solve the glitch issue.

Please also note that the embedding processing circuit 330 (including the sampling-and-holding unit 331, the adder 332, the comparator 333 and the SAR logic 334) is enabled during the receiving phase, while it should be disabled during the transmitting phase in order to avoid erroneous behaviors of the embedded DAC unit 240. Similarly, the digital input signal $S_{DIN}$ and the buffer 260 are enabled during the transmitting phase, while they should be disabled during the receiving phase in order to avoid erroneous behaviors of the embedded DAC unit 240. Therefore, during the receiving phase, only the digital code D_code is allowed to get into the embedded DAC unit 240 to be converted into the analog signal $S_A$; and during the transmitting phase, only the digital input signal $S_{DIN}$ is allowed to get into the embedded DAC unit 240 to be converted into the DAC output signal $S_{DAC}$. It should be noted that the abovementioned method is for illustrative purposes only, and is not meant to be a limitation to the scope of the present disclosure. Specifically, any means capable of controlling/selecting the signals inputted to and outputted from the embedded DAC unit 240 can be employed by the transceiver 300. These alternative designs all obey the spirit of the present disclosure.

Figure 4:
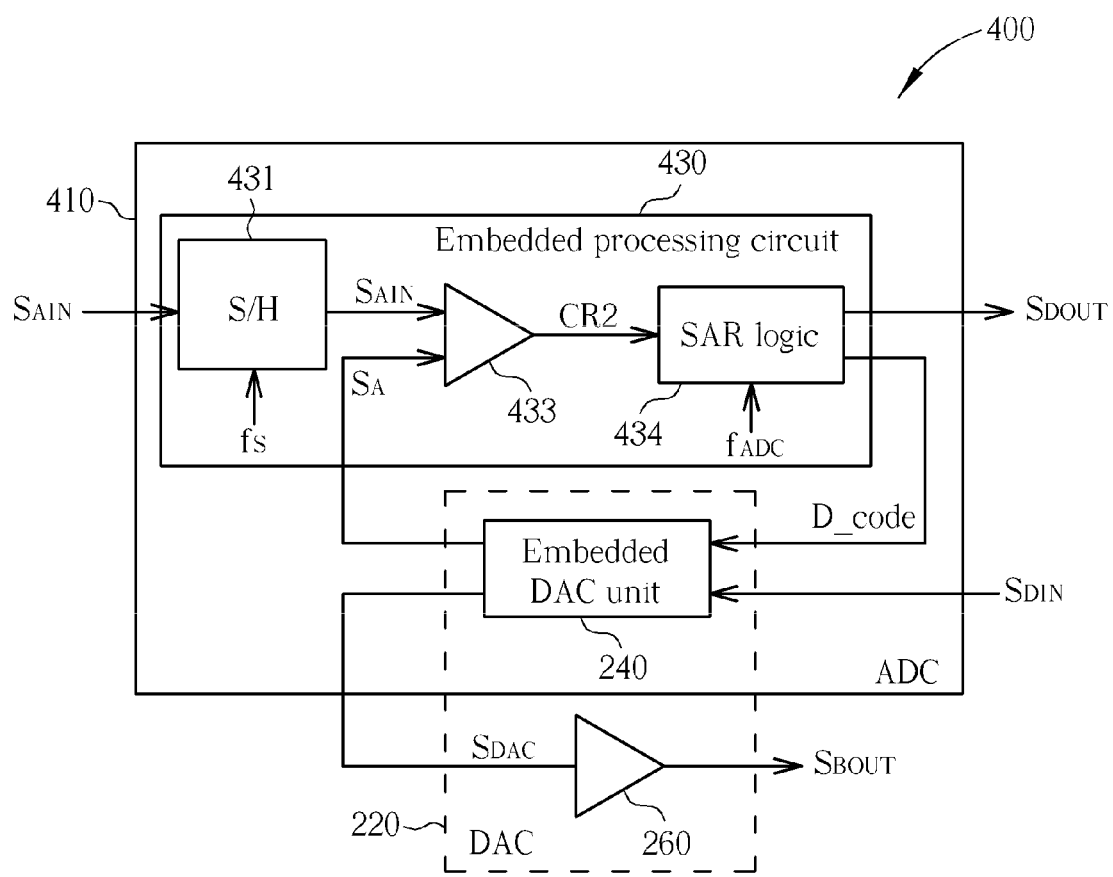
FIG. 4 is a diagram of a transceiver according to a third exemplary embodiment of the present disclosure.

FIG. 4 is a diagram of a transceiver 400 according to a third exemplary embodiment of the present disclosure. In FIG. 4, the architecture of the transceiver 400 is similar to that of the transceiver 300 shown in FIG. 3, and the difference between them is that the adder 332 originally adopted in the embedded processing circuit 330 of the transceiver 300 is removed from the embedded processing circuit 430 of the transceiver 400. That is to say, in this embodiment, the embedded processing circuit 430 only includes a sampling-and-holding unit 431, a comparator 433, and a SAR logic 434, wherein the comparator 433 is arranged to directly compare the analog input signal $S_{AIN}$ with the analog signal $V_{REF}$ so as to generate a comparison result CR2. After that, the SAR logic 434 provides the digital code D_code according to the comparison result CR2.

The transceivers shown in FIG. 2, FIG. 3, and FIG. 4 are merely practicable embodiments of the present disclosure and, as is well known by persons of ordinary skill in the art, suitable variations can be made to the transceivers 200, 300, and 400. Please refer to FIG. 5 (including 5A and 5B) and FIG. 6 (including 6A and 6B), which show several varied embodiments of the transceiver 400 shown in FIG. 4.

As shown in 5A, the architecture of the transceiver 500 is similar to that of the transceiver 400 in FIG. 4, and the difference between them is that the transceiver 500 further includes an embedded selecting unit 570 being disposed inside the ADC 510. Herein the embedded selecting unit 570 has a first input port 571 coupled the embedded processing circuit 430, a second input port 572 arranged to receive the digital input signal $S_{DIN}$, and an output port 573 coupled to the embedded DAC unit 240. Be noted that the embedded selecting unit 570 is arranged to have the output port 573 coupled to the first input port 571 during the receiving phase, and is arranged to have the output port 573 coupled to the second input port 572 during the transmitting phase. In other words, the embedded selecting unit 570 allows the digital code D_code to get in the embedded DAC unit 240 during the receiving phase, and allows the digital input signal $S_{DIN}$ to get in the embedded DAC unit 240 during the transmitting phase in order to avoid erroneous behaviors.

As shown in 5B, the architecture of the transceiver 600 is similar to that of the transceiver 500 shown in 5A, and the difference between them is that a selecting unit 670 of the transceiver 600 is external to the ADC 610 rather than inside the ADC 610. As the connection manners and related operations of the selecting unit 670 are the same as that of the embedded selecting unit 570 shown in 5A, therefore, detailed description is omitted here for brevity.

As shown in 6A, the architecture of the transceiver 700 is similar to that of the transceiver 500 shown in 5A, and the difference between them is that the transceiver 700 further includes a second embedded selecting unit 770 being disposed inside the ADC 710. Herein the second embedded selecting unit 770 has an input port 771 coupled to the embedded DAC unit 240, a first output port 772 coupled to the embedded processing circuit 430, and a second output port 773 coupled to the buffer 260. Be noted that the second embedded selecting unit 770 is arranged to have the input port 771 coupled to the first output port 772 during the receiving phase, and is arranged to have the input port 771 coupled to the second output port 773 during the transmitting phase. In other words, the second embedded selecting unit 770 allows the analog signal $S_A$ to output to the embedded processing circuit 430 during the receiving phase, and allows the DAC output signal $S_{DAC}$ to be outputted to the buffer 260 during the transmitting phase in order to avoid erroneous behaviors.

As shown in 6B, the architecture of the transceiver 800 is similar to that of the transceiver 600 shown in 5B, and the difference between them is that the transceiver 800 further includes a second selecting unit 870 being disposed external to the ADC 810. As the connection manners and related operations of the selecting unit 870 are the same as that of the embedded selecting unit 770 shown in 6A, therefore, detailed description is omitted here for brevity.

As mentioned above, the DAC output signal $S_{DAC}$ might be related to the analog signal $S_A$. Because the DAC output signal $S_{DAC}$ and the analog signal $S_A$ are generated during different operational phases, they can share the same output path, which is also illustrated in 5A and 5B. Or the DAC output signal $S_{DAC}$ and the analog signal $S_A$ can select different output paths by the selecting unit 770/870, which is also illustrated in 6A and 6B.

Figure 5:
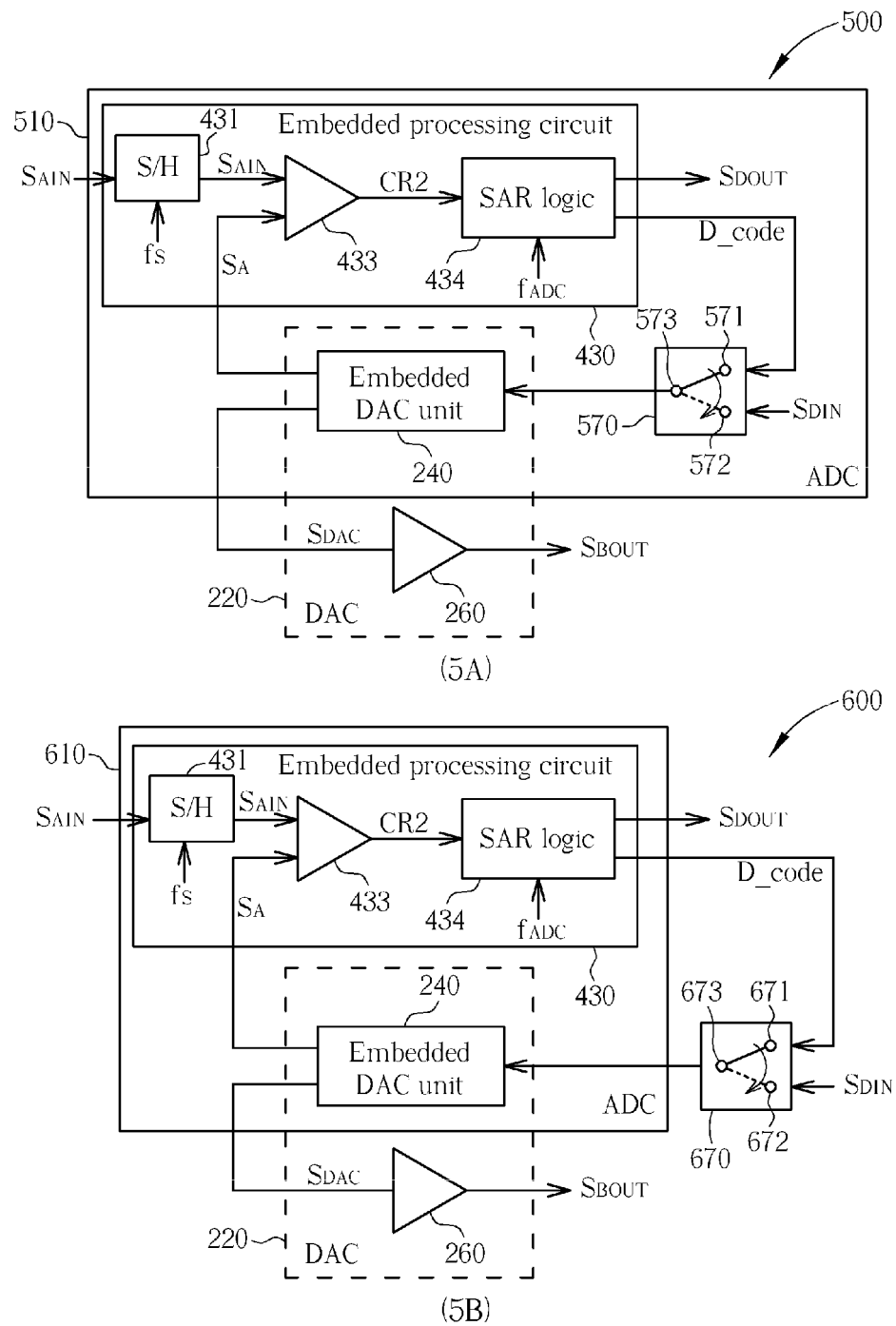
FIG. 5 (including 5A and 5B) is a diagram of a transceiver according to a fourth exemplary embodiment of the present disclosure.
Figure 6:
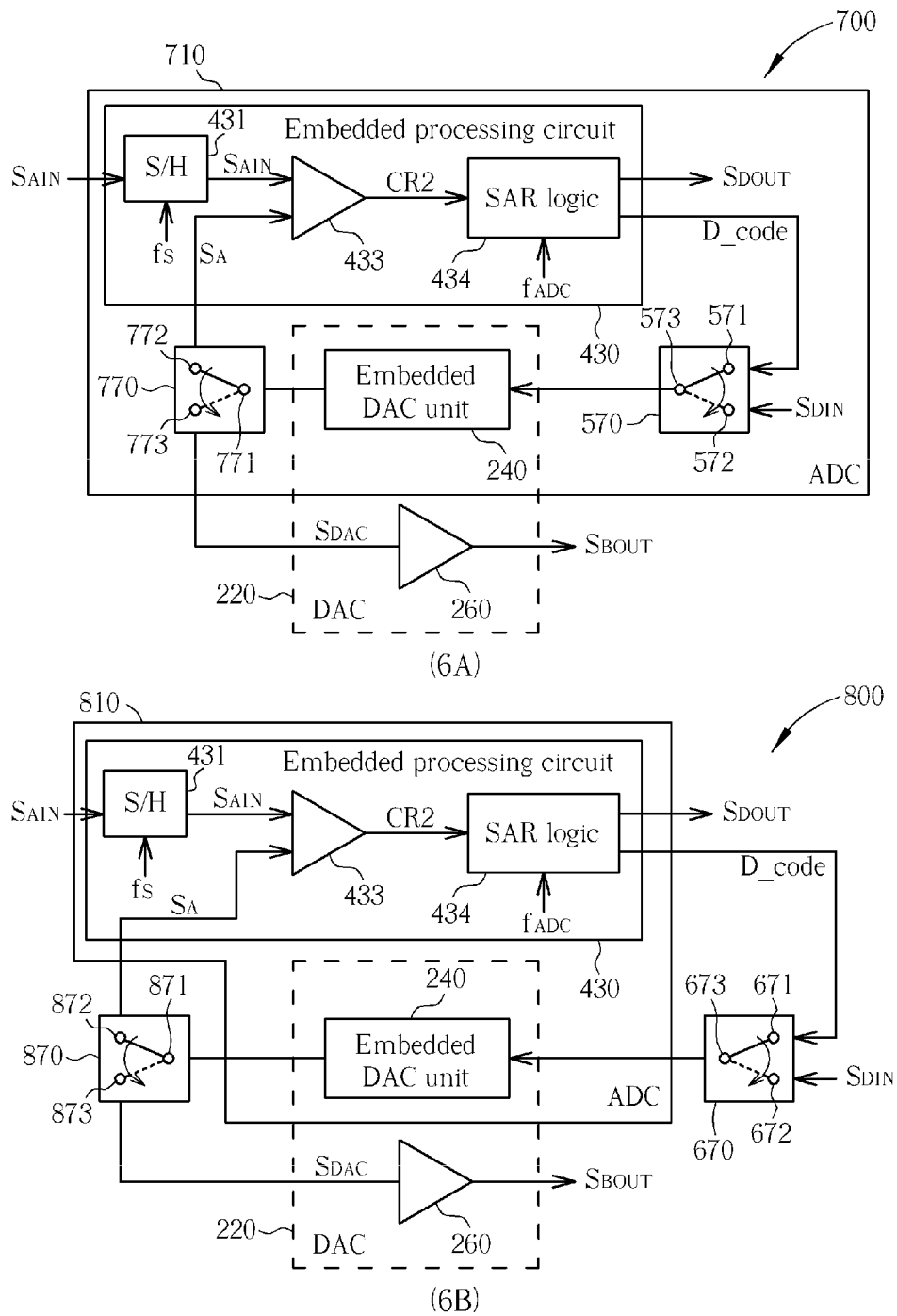
FIG. 6 (including 6A and 6B) is a diagram of a transceiver according to a fifth exemplary embodiment of the present disclosure.

As FIG. 4, FIG. 5, and FIG. 6 depict, the number, the location, and the type of the selecting units are not limited. Those skilled in the art should appreciate that various modifications of the selecting unit included by the transceiver may be made without departing from the spirit of the present disclosure, which should also belong to the scope of the present disclosure.

FIG. 7 is a diagram of a transceiver 900 according to a sixth exemplary embodiment of the present disclosure. The transceiver 900 includes an ADC 910 as well as a buffer 260, wherein the ADC 910 also includes an embedded processing circuit 930 and an embedded DAC unit 240. In this embodiment, the ADC 910 is implemented by a continuous-time sigma-delta ADC. As can be seen from FIG. 7, the embedded processing circuit 930 further includes a summation unit 931, a loop filter 932, and a quantizer 933. The loop filter 932 is continuous-time and the sampling operation is realized right before the quantizer 933 instead of at the input of the ADC 910 as it is done in the case of discrete-time sigma-delta ADC. In other words, the digital output signal $S_{DOUT}$ is discrete-time (DT), while the analog input signal $S_{AIN}$ is continuous-time (CT). What calls for special attention is that the embedded DAC unit 240 is arranged to perform a DT-to-CT transformation upon the digital output signal $S_{DOUT}$ to create the analog signal $S_A$ (i.e., the CT feedback signal) during a first operational phase of the transceiver 900, and is arranged to convert the digital input signal $S_{DIN}$ into the DAC output signal $S_{DAC}$ during a second operational phase of the transceiver 900.

Furthermore, a buffer 260 is coupled to the embedded DAC unit 240 of the ADC 910, for buffering the DAC output signal $S_{DAC}$ to generate a buffer output signal $S_{BOUT}$. As a result, a combination of the embedded DAC unit 240 and the buffer 260 acts as a DAC (e.g., 220, which is also represented by dotted lines) arranged to convert the digital input signal $V_{DIN}$ into the buffer output signal $S_{BOUT}$ during the second operational phase of the transceiver 900.

Figure 8:
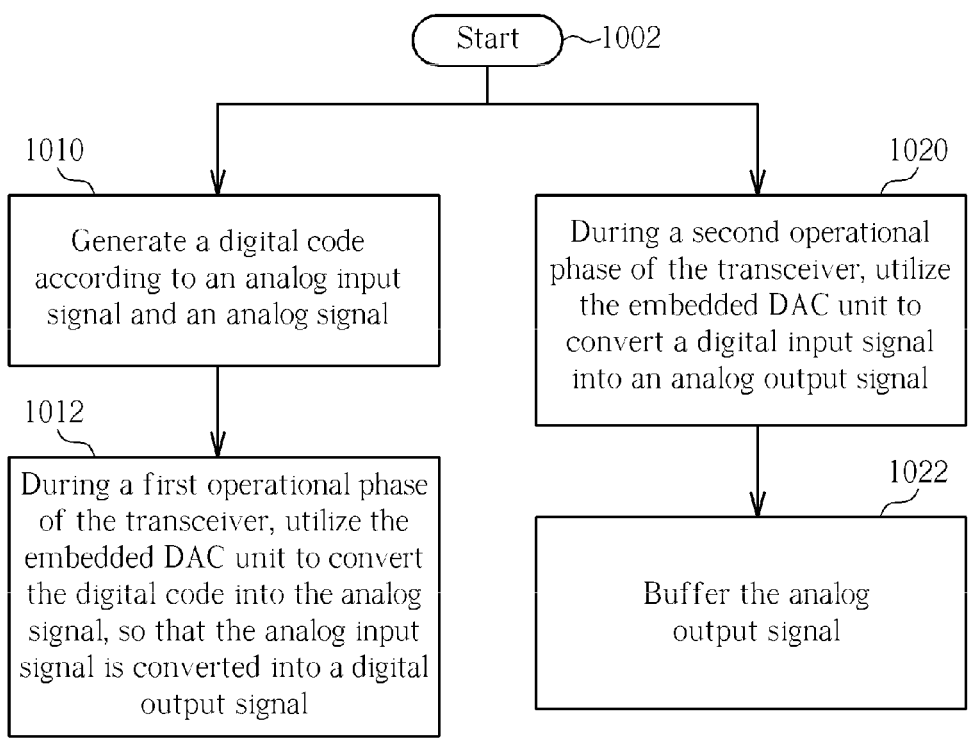
FIG. 8 is a flowchart illustrating a method for converting signals of a transceiver according to an exemplary embodiment of the present disclosure.

FIG. 8 is a flowchart illustrating a method for converting signals of a transceiver according to an exemplary embodiment of the present disclosure. Please note that the following steps are not limited to be performed according to the exact sequence shown in FIG. 8 if a roughly identical result can be obtained. The method includes, but is not limited to, the following steps:

Step 1002: Start.

Step 1010: Generate a digital code according to an analog input signal and an analog signal.

Step 1012: During a first operational phase of the transceiver, utilize the embedded DAC unit to convert the digital code into the analog signal, so that the analog input signal is converted into a digital output signal.

Step 1020: During a second operational phase of the transceiver, utilize the embedded DAC unit to convert a digital input signal into an analog output signal.

Step 1022: Buffer the analog output signal.

How each element operates can be known by collocating the steps shown in FIG. 8 with the elements shown in FIG. 2, FIG. 3, FIG. 4, FIG. 5, FIG. 6, or FIG. 7 and further description is omitted here for brevity. Be noted that the steps 1010 and 1020 are executed during the first operational phase (i.e., the receiving phase) of the transceiver, and the steps 1020 and 1022 are executed during the second operational phase (i.e., the transmitting phase) of the transceiver. In addition, the steps of the abovementioned flowchart are merely a practicable embodiment of the present disclosure, and in no way should be considered to be limitations of the scope of the present disclosure. The method can include other intermediate steps or several steps can be merged into a single step without departing from the spirit of the present disclosure.

The abovementioned embodiments are presented merely for describing the present disclosure, and in no way should be considered to be limitations of the scope of the present disclosure. In summary, the present disclosure provides a transceiver having an ADC (e.g., an RXADC) and a DAC (e.g., a TXDAC) which share the same embedded DAC unit of the RXADC. By reusing the embedded DAC unit of the RXADC to perform the conversion during the receiving phase (i.e., $S_{AIN} \rightarrow S_{DOUT}$) and the conversion during the transmitting phase (i.e., $S_{DIN} \rightarrow S_{DAC}$), the individual DAC unit originally adopted in the TXDAC can be saved. As a result, a goal of saving cost and reducing layout area can be achieved. In addition, one or multiple selecting units can be added into the transceiver, so that erroneous behaviors can be avoided. Furthermore, as is well known by persons of ordinary skill in the art, suitable variations can be applied to the selecting units without departing from the spirit of the present disclosure. That is to say, the number, the location, and the type of the selecting units are not limited.

Those skilled in the art will readily observe that numerous modifications and alterations of the device and method may be made while retaining the teachings of the disclosure.

What is claimed is:

1. A transceiver, comprising:
    an analog-to-digital converter (ADC), arranged to convert an analog input signal into a digital output signal during a first operational phase of the transceiver, the ADC comprising:
        an embedded processing circuit, arranged to generate a digital code according to the analog input signal and an analog signal; and
        an embedded digital-to-analog converting (DAC) unit, coupled to the embedded processing circuit, wherein the embedded DAC unit is arranged to convert the digital code into the analog signal during the first operational phase, and is arranged to convert a digital input signal into an analog output signal during a second operational phase of the transceiver.

2. The transceiver of claim 1, further comprising a buffer, coupled to the embedded DAC unit of the ADC and arranged to buffer the analog output signal.

3. The transceiver of claim 2, wherein the first operational phase is a receiving phase, and the second operational phase is a transmitting phase, whereby a combination of the embedded DAC unit and the buffer acts as a transmitting DAC (TXDAC) arranged to convert the digital input signal into the analog output signal during the transmitting phase.

4. The transceiver of claim 2, wherein the ADC further comprises:
    a selecting unit, having an input port coupled to the embedded DAC unit, a first output port coupled to the embedded processing circuit, and a second output port coupled to the buffer, wherein the selecting unit is arranged to have the input port coupled to the first output port during the first operational phase, and is arranged to have the input port coupled to the second output port during the second operational phase.

5. The transceiver of claim 1, wherein the ADC is implemented by a successive-approximation register (SAR) ADC, and the embedded processing circuit comprises:
    a comparator, arranged to compare the analog input signal with the analog signal to generate a comparison result; and
    a SAR logic, coupled to the comparator, for providing the digital code according to the comparison result.

6. The transceiver of claim 1, wherein the ADC is implemented by a successive-approximation register (SAR) ADC, and the embedded processing circuit comprises:
    an adder, arranged to perform an adding operation upon the analog input signal and the analog signal to generate an operating result;
    a comparator, arranged to compare the operating result with an threshold to generate a comparison result; and
    a SAR logic, coupled to the comparator, for providing the digital code according to the comparison result.

7. The transceiver of claim 1, wherein the ADC further comprises:
    a selecting unit, having a first input port coupled to the embedded processing circuit, a second input port arranged to receive the digital input signal, and an output port coupled to the embedded DAC unit, wherein the selecting unit is arranged to have the output port coupled to the first input port during the first operational phase, and is arranged to have the output port coupled to the second input port during the second operational phase.

8. The transceiver of claim 1, wherein the ADC is implemented by a sigma-delta ADC.

9. The transceiver of claim 1, wherein the embedded DAC unit is implemented by a switched-capacitor DAC, a resistor-string DAC, or a combination of a switched-capacitor DAC and a resistor-string DAC.

10. The transceiver of claim 1, being applied to a time-domain duplex (TDD) system.

11. A method for converting signals of a transceiver, the transceiver comprising an analog-to-digital converter (ADC), the ADC comprising an embedded processing circuit and an embedded digital-to-analog converting (DAC) unit, and the method comprising the following steps of:
    generating a digital code according to an analog input signal and an analog signal;
    during a first operational phase of the transceiver, utilizing the embedded DAC unit to convert the digital code into the analog signal, so that the analog input signal is converted into a digital output signal; and
    during a second operational phase of the transceiver, utilizing the embedded DAC unit to convert a digital input signal into an analog output signal.

12. The method of claim 11, further comprising:
    buffering the analog output signal.

13. The method of claim 11, wherein the first operational phase is a receiving phase, and the second operational phase is a transmitting phase.

14. The method of claim 11, wherein the ADC is implemented by a successive-approximation register (SAR) ADC, and the step of generating the digital code according to the analog input signal and the analog signal comprises:
    comparing the analog input signal with the analog signal to generate a comparison result; and
    providing the digital code according to the comparison result.

15. The method of claim 11, wherein the ADC is implemented by a successive-approximation register (SAR) ADC, and the step of generating the digital code according to the analog input signal and the analog signal comprises:
    performing an adding operation upon the analog input signal and the analog signal to generate an operating result;
    comparing the operating result with an threshold to generate a comparison result; and
    providing the digital code according to the comparison result.

16. The method of claim 11, further comprising:
during the first operational phase of the transceiver, selecting to input the digital code into the DAC unit; and
during the second operational phase of the transceiver, selecting to input the digital input signal into the DAC unit.

17. The method of claim 11, further comprising:
during the first operational phase of the transceiver, selecting to output the analog signal from the DAC unit to the embedded processing circuit; and
during the second operational phase of the transceiver, selecting to output the analog output signal from the DAC unit to a buffer.

18. The method of claim 11, being applied to a time-domain duplex (TDD) system.

* * * * *